United States Patent
Chen et al.

(10) Patent No.: US 9,705,466 B2
(45) Date of Patent: Jul. 11, 2017

(54) SEMICONDUCTOR DEVICE WITH GUARD RING COUPLED RESONANT CIRCUIT

(71) Applicant: TAIWAN SEMICONDUCTOR MANUFACTURING COMPANY, LTD., Hsinchu (TW)

(72) Inventors: Yen-Jen Chen, Hsinchu (TW); Chi-Feng Huang, Hsinchu (TW); Hsiao-Chun Lee, Hsinchu (TW); Hsieh-Hung Hsieh, Hsinchu (TW); Tzu-Jin Yeh, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/630,946

(22) Filed: Feb. 25, 2015

(65) Prior Publication Data

US 2016/0248394 A1    Aug. 25, 2016

(51) Int. Cl.
*H03H 1/00*    (2006.01)
*H03H 7/01*    (2006.01)
(Continued)

(52) U.S. Cl.
CPC ............ *H03H 1/00* (2013.01); *H01L 23/585* (2013.01); *H01L 28/10* (2013.01); *H01L 28/40* (2013.01);
(Continued)

(58) Field of Classification Search
CPC .......... H03H 7/0115; H03H 1/00; H03H 3/00; H03H 2001/0064; H01L 28/10; H01L 28/40; H01L 2223/6672
(Continued)

(56) References Cited

U.S. PATENT DOCUMENTS 7,023,315 B2 *  4/2006  Yeo ..................... H01L 23/5227
                                            257/531
7,418,251 B2 *  8/2008  Liu ...................... H03H 7/0115
                                            333/175
(Continued)

FOREIGN PATENT DOCUMENTS

JP    2000-323651    11/2000
JP    2004-327941    11/2004
(Continued)

OTHER PUBLICATIONS

"Effect of a Ground Shield of a Silicon On-Chip Spiral Inductor"; Murata et al.; Microwave Conference, Dec. 2000; IEEE.*
(Continued)

*Primary Examiner* — Stephen E Jones
*Assistant Examiner* — Rakesh Patel
(74) *Attorney, Agent, or Firm* — Hauptman Ham, LLP

(57) ABSTRACT

A semiconductor device comprises a guarded circuit. The semiconductor device also comprises a guard ring surrounding the guarded circuit. The semiconductor device further comprises a resonant circuit coupled with the guard ring. The resonant circuit comprises an input node coupled with the guard ring. The resonant circuit also comprises an inductor. The resonant circuit further comprises a capacitor coupled with the inductor. The resonant circuit additionally comprises a ground node configured to carry a ground voltage. The inductor and the capacitor are coupled between the input node and the ground node.

20 Claims, 8 Drawing Sheets

(51) Int. Cl.
 *H03H 3/00* (2006.01)
 *H01L 49/02* (2006.01)
 *H01L 23/58* (2006.01)
 *H01L 23/66* (2006.01)

(52) U.S. Cl.
 CPC ............ *H03H 3/00* (2013.01); *H03H 7/0115* (2013.01); *H01L 23/66* (2013.01); *H01L 2223/6672* (2013.01); *H03H 2001/0064* (2013.01)

(58) Field of Classification Search
 USPC ................ 333/175, 185; 361/306.3; 336/200
 See application file for complete search history.

(56) References Cited

U.S. PATENT DOCUMENTS

| | | | |
|---|---|---|---|
| 8,279,008 B2 | 10/2012 | Hsieh et al. | |
| 8,427,240 B2 | 4/2013 | Hsieh et al. | |
| 8,593,206 B2 | 11/2013 | Chen et al. | |
| 8,610,494 B1 | 12/2013 | Jin et al. | |
| 8,618,631 B2 | 12/2013 | Jin et al. | |
| 2004/0125541 A1* | 7/2004 | Chung | H01G 4/228 361/306.3 |
| 2004/0212039 A1 | 10/2004 | Yamamoto | |
| 2005/0068146 A1* | 3/2005 | Jessie | H01F 17/0006 336/200 |
| 2009/0284339 A1* | 11/2009 | Choi | H01F 17/0013 336/200 |
| 2012/0092230 A1 | 4/2012 | Hung et al. | |
| 2013/0234305 A1 | 9/2013 | Lin et al. | |
| 2014/0132333 A1 | 5/2014 | Jin et al. | |
| 2014/0217546 A1 | 8/2014 | Yen et al. | |
| 2014/0253262 A1 | 9/2014 | Hsieh et al. | |
| 2014/0253391 A1 | 9/2014 | Yen | |

FOREIGN PATENT DOCUMENTS

| | | |
|---|---|---|
| JP | 2011120105 | 6/2011 |
| KR | 20010020857 | 3/2001 |

OTHER PUBLICATIONS

Office Action dated Sep. 19, 2016 and English translation from corresponding application No. KR 10-2015-0147916.

Notice of Allowance dated Mar. 30, 2017 and English translation from corresponding application No. KR 10-2015-0147916.

\* cited by examiner

SEMICONDUCTOR DEVICE WITH GUARD RING COUPLED RESONANT CIRCUIT

BACKGROUND

Semiconductor device manufacturers are challenged to deliver products that perform with an expected level of quality. Some semiconductor devices comprise multiple circuits. Sometimes one circuit of a semiconductor device will introduce noise that interferes with the operation of another circuit of the semiconductor device. This introduction of noise between circuits in a semiconductor device often degrades the performance of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
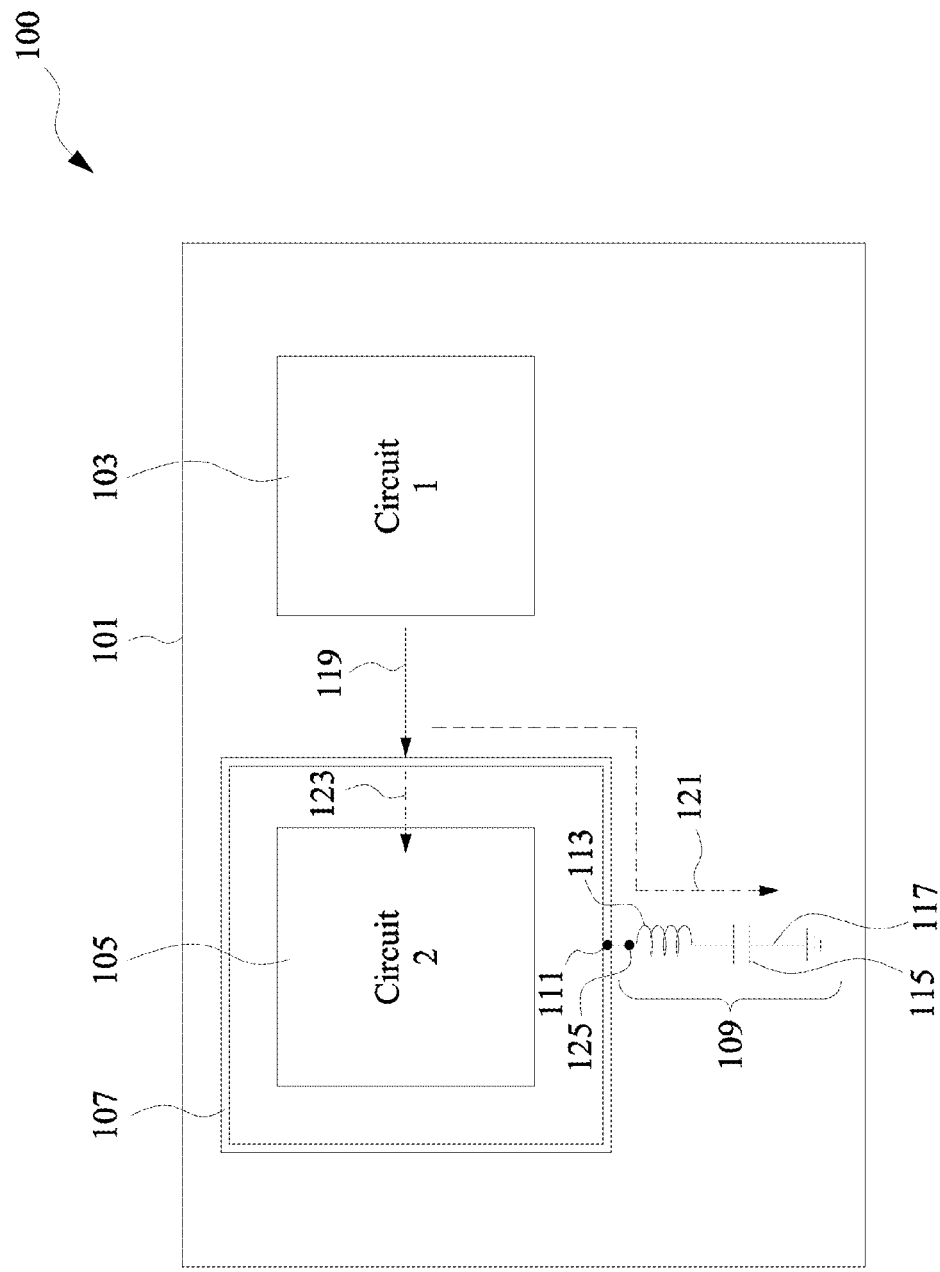
FIG. 1 is a plan view of a semiconductor device having a noise suppression structure, in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some semiconductor devices comprise multiple circuits that are integrated on a same chip or substrate. For example, some semiconductor devices comprise digital circuits and radio frequency (RF) or analog circuits on a same chip. The digital circuits sometimes produce switching transient noise, which is coupled through the substrate to the RF/analog circuit, in some instances. The switch transient noise introduces signal cross-talk to the RF/analog circuit, which degrades the performance of the semiconductor device. Accordingly, protecting a noise-sensitive circuit from switch transient noise helps to reduce degradation in performance of the noise-sensitive circuit.

FIG. 1 is a plan view of a semiconductor device 100 having a noise suppression structure, in accordance with one or more embodiments Semiconductor device 100 comprises a substrate 101, a first circuit 103 connected to the substrate 101, a second circuit 105 connected to the substrate 101, a guard ring 107 surrounding the second circuit 105, and a resonant circuit 109 coupled with the guard ring 107.

Substrate 101 comprises a semiconductor material such as silicon or some other suitable substrate material. First circuit 103 is a noise producing circuit such as a digital circuit or other type of circuit capable of producing noise that potentially interferes with the operation of second circuit 105. In some embodiments, second circuit 103 has an operating frequency of at least about 1.00 gigahertz (GHz). In some embodiments, second circuit 103 has an operating frequency that is less than 1.00 GHz. Second circuit 105 is a noise-sensitive circuit that is susceptible to noise generated by the first circuit 103. In some embodiments, second circuit 105 is an RF circuit, an analog circuit, or some other circuit that could experience an adverse effect induced by noise from the first circuit 103. In some embodiments, second circuit 105 is a voltage control oscillator (VCO), or some other noise-sensitive circuit. In some embodiments, the first circuit 103 is inside the guard ring 107 and the second circuit 105 is outside the guard ring 107. In some embodiments, an additional guard ring (not shown) surrounds the first circuit 103.

In some embodiments, the guard ring 107 is a p-doped well region formed in the substrate 101. Alternatively, the guard ring 107 is an n-doped well region formed in the substrate 101. In some embodiments, the guard ring 107 comprises one or more metal layers that surround the second circuit 105. In some embodiments, one or more portions of the guard ring 107 are one or more of embedded in the substrate 101 or formed over the substrate 101. In some embodiments, an entirety of the guard ring 107 is embedded in the substrate 101. In other embodiments, an entirety of the guard ring 107 is over the substrate 101.

Resonant circuit 109 comprises an input node 111 coupled with the guard ring 107, an inductor 113, a capacitor 115 coupled with the inductor, and a ground node 117 configured to carry a ground voltage. The inductor 113 and the capacitor 115 are coupled in series between the input node 111 and the output node 117. In some embodiments, the resonant circuit 109 is called a series resonant circuit or a series resonator circuit. Inductance is often symbolized by the letter "L" and capacitance is often symbolized by the letter "C." As such, the resonant circuit 109 is also called an LC resonant circuit or an LC resonator circuit, in some embodiments.

The inductor 113 and the capacitor 115 are capable of being arranged in the resonator circuit 109 in any suitable order. For example, a first side of the inductor 113 is coupled with the input node 111, a second side of the inductor 113 is coupled with the capacitor 115, and a side of the capacitor 115 opposite the inductor 113 is coupled with the ground node 117. The inductor 113 is closer to the guard ring 107 than the capacitor 115 in the resonant circuit 109. In some embodiments, a first side of the capacitor 115 is coupled with the input node 111, a second side of the capacitor 115 is coupled with the inductor 113 and a side of the inductor 113 opposite the capacitor 115 is coupled with the ground node 117. In some embodiments, the capacitor 115 is closer to the guard ring 107 than the capacitor in the resonant circuit 109.

The inductor is 113 a spiral inductor. In some embodiments, the inductor 113 is a meander line inductor, a transformer, a transmission line, or some other suitable type of inductor. The capacitor 115 is a parallel plate capacitor or some other suitable type of capacitor. In some embodiments, the capacitor 115 is a metal-insulator-metal (MIM) capacitor, a metal-oxide-metal (MOM) capacitor, a metal-oxide-silicon (MOS) capacitor, or some other suitable form of capacitor.

First circuit 103 is outside the guard ring 107 and introduces noise 119 into substrate 101. Guard ring 107 surrounds the second circuit 105, and is configured to isolate the second circuit 105 from the noise 119, or at least suppress the amount of noise 119 introduced to the second circuit 105. The suppressed noise 121 intercepted by the guard ring 107 is dissipated to the ground node 117 through the resonant circuit 109.

The resonant circuit 109 is outside the guard ring 107. In some embodiments, some or all of the resonant circuit 109 is over the guard ring 107. For example, some of all of the resonant circuit 109 is in a metal layer or a layer of the semiconductor device 100 that is different from a layer in which the guard ring 107 is formed. In some embodiments, the inductor 113 is over the guard ring 107 and/or the capacitor 115 is over the guard ring 107. Configuring the semiconductor device 100 to have one or more of the inductor 113 or the capacitor 115 over the guard ring 107 has the added benefit of saving chip area on substrate 101, which helps to reduce an overall size the semiconductor device and to reduce noise introduced to the second circuit 105.

The first circuit 103 has an operating frequency and noise 119 has a corresponding noise frequency. The guard ring 107 and the resonant circuit 109 are configured to isolate or at least suppress the amount of noise 119 that is introduced to the second circuit 105 for a predetermined range of frequencies. The amount of noise 119 that is introduced to the second circuit 105, if any, is limited to residual noise 123 which is the difference between noise 119 and suppressed noise 121.

Though discussed generally with regard to a single resonant circuit 109, in some embodiments, the semiconductor device 100 comprises more than one resonant circuit 109. Simulation results have demonstrated that the quantity of the resonator circuit(s) 109 and/or the configuration of the resonator circuit(s) 109 has an effect on the range of operating frequencies in which, and a degree with which, the guard ring 107 and the resonant circuit(s) 109 structure is effective at isolating the second circuit 105 from noise 119.

In view of the foregoing, the semiconductor device 100 provides the ability to configure an arrangement of one or more resonant circuits 109 that are coupled with the guard ring 107 to suppress noise 119 generated by first circuit 103 that would otherwise interfere with the operation of second circuit 105. The configured arrangement of one or more resonant circuits 109 is selectable to achieve a predetermined frequency range within which noise suppression is desired, thereby making the frequency range within which noise is suppressed selectable. In some embodiments, semiconductor device 100 optionally comprises one or more switches configured to be selectively actuated to couple or uncouple a desired quantity of resonant circuits 109 to change the frequency range within which noise is suppressed. Such a switch is optionally included in one or more resonant circuits 109 at a node 125 between input node 111 and inductor 113 or capacitor 115. In some embodiments, node 125 is optionally between guard ring 107 and the input node 111 of one or more resonant circuits 109.

The resonant circuit 109 is a passive device that is capable of operating without an associated power supply. As such, the noise suppression structure that includes the guard ring 107 and the resonant circuit 109 is capable of suppressing noise 119 without consuming additional power.

Figure 2A:
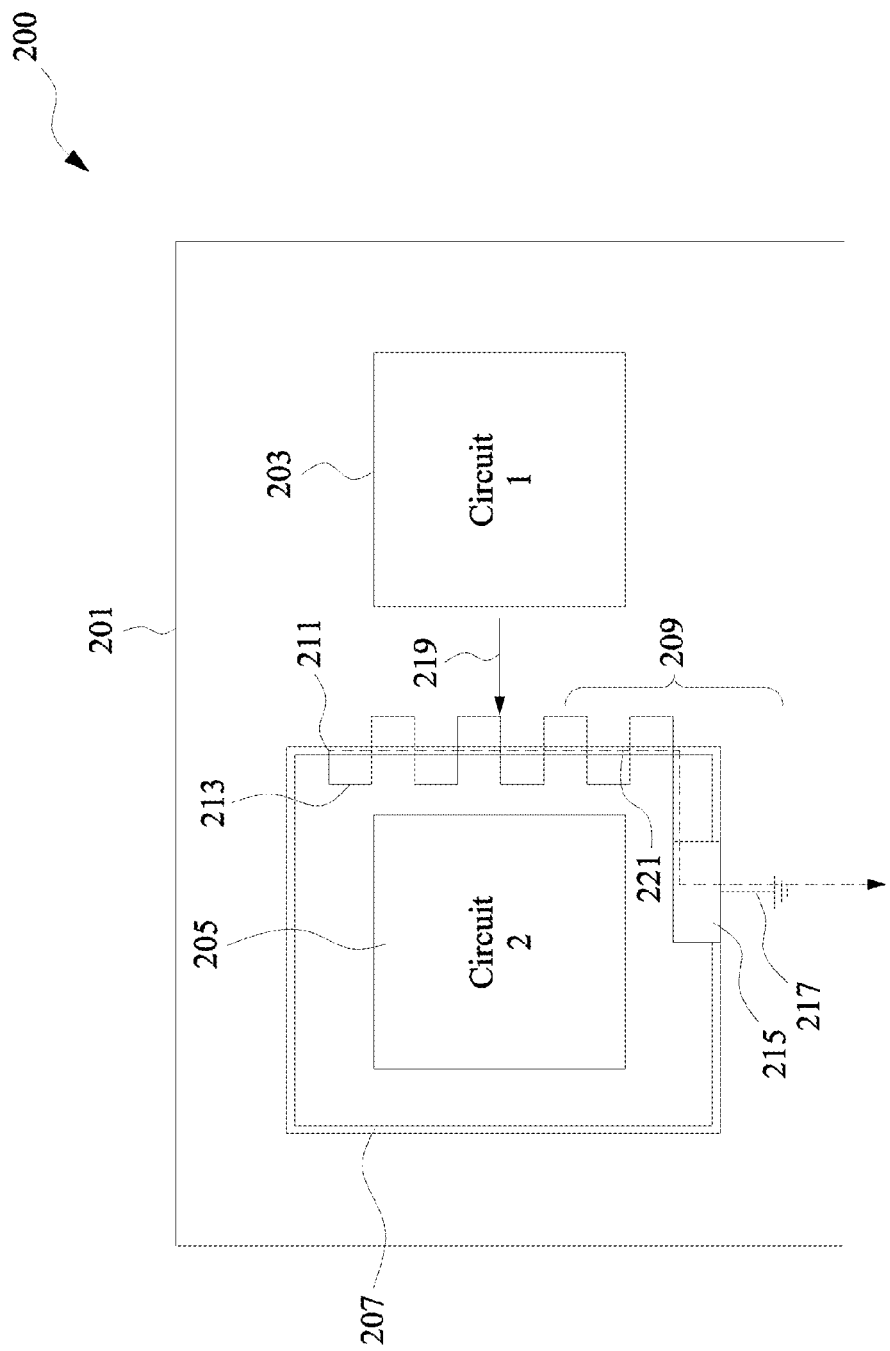
FIG. 2A is a plan view of a semiconductor device having a noise suppression structure, in accordance with one or more embodiments.

FIG. 2A is a plan view of a semiconductor device 200 having a noise suppression structure, in accordance with one or more embodiments. Semiconductor device 200 comprises features similar to semiconductor device 100 (FIG. 1), with the reference numerals increased by 100.

Semiconductor device 200 comprises a resonant circuit 209 that includes a meander line inductor 213 and a MOM capacitor 215 over the guard ring 207. Input node 211 of the resonant circuit 209 is coupled with the guard ring 207. In some embodiments, input node 211 of the resonant circuit is coupled with the guard ring 207 by a via (not shown) or a conductive plug (not shown). Noise 219 generated by the first circuit 203 is suppressed by the guard ring 207 and resonant circuit 209 structure such that suppressed noise 221 intercepted by the guard ring 207 is dissipated through the meander line inductor 213 through the MOM capacitor 215 to the ground node 217. The second circuit 205 is thereby protected from the suppressed noise 221.

Figure 2B:
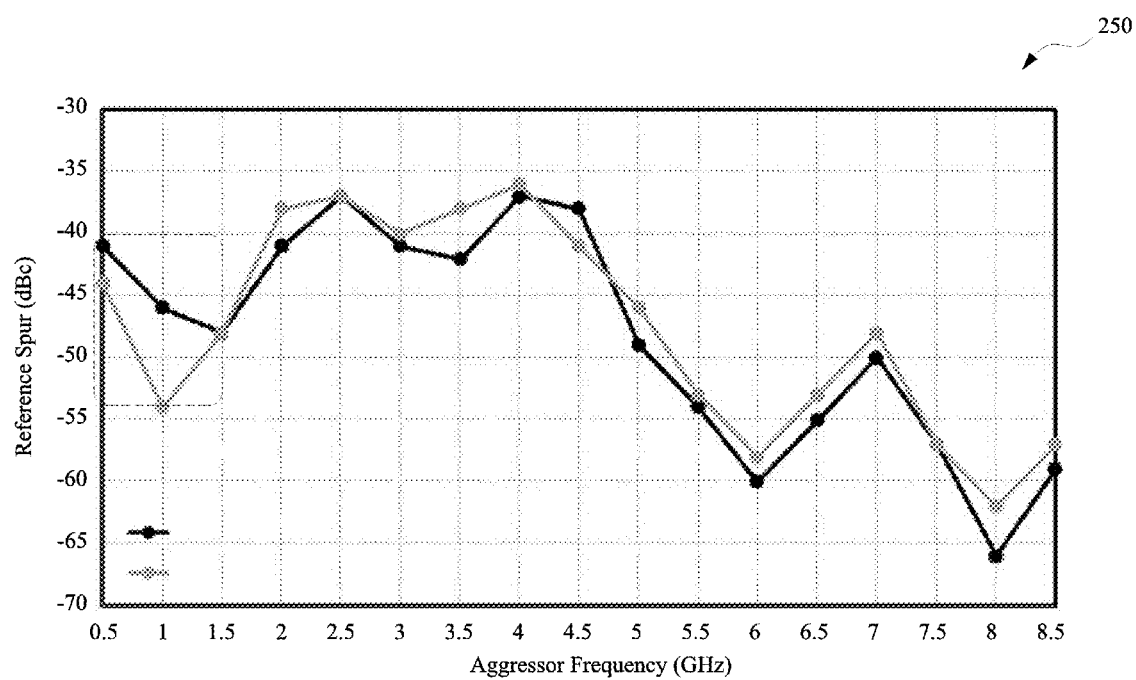
FIG. 2B is a graph showing simulation results demonstrating the effectiveness of the semiconductor device of FIG. 2A at suppressing noise, in accordance with one or more embodiments.

FIG. 2B is a graph 250 showing simulation results demonstrating the effectiveness of semiconductor device 200 at suppressing noise, in accordance with one or more embodiments.

An experiment was conducted to compare the noise suppression capabilities of semiconductor device 200 to the noise suppression capabilities of a semiconductor device that included a guard ring alone, i.e., without resonator circuit 209. The tested embodiment of semiconductor device 200 included resonant circuit 209 that comprised meander line inductor 213 and MOM capacitor 215 over guard ring 207. The simulation results revealed that semiconductor device 200 improved noise suppression by about 8.00 decibels (dB) at an operating frequency of 1.00 GHz compared to the semiconductor device that included a guard ring alone.

Figure 3A:
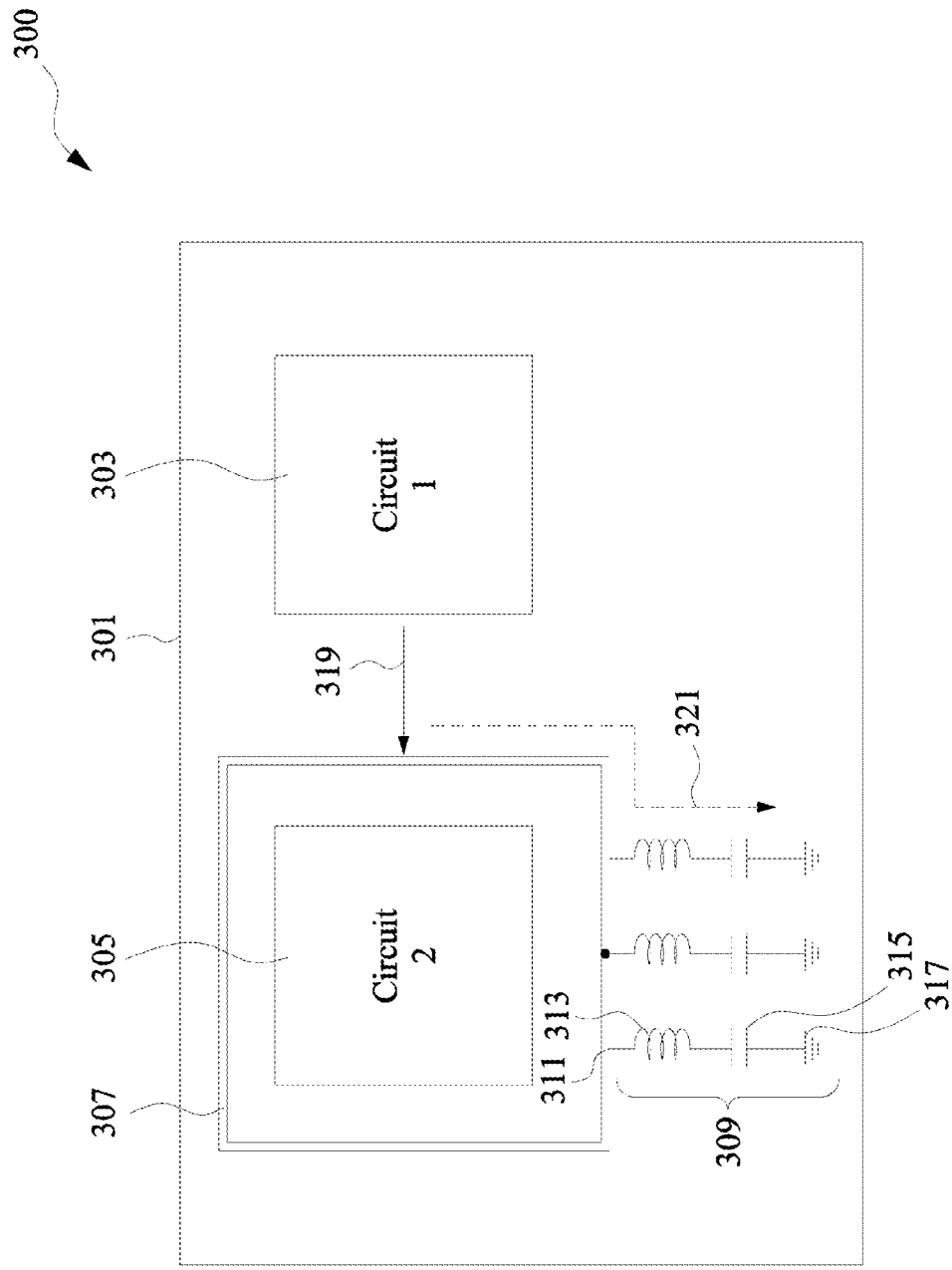
FIG. 3A is a plan view of a semiconductor device having a noise suppression structure, in accordance with one or more embodiments.

FIG. 3A is a plan view of a semiconductor device 300 having a noise suppression structure, in accordance with one or more embodiments. Semiconductor device 300 comprises features similar to semiconductor device 100 (FIG. 1), with the reference numerals increased by 200.

Semiconductor device 300 comprises three resonant circuits 309 that comprise an inductor 313 and a capacitor 315. The resonant circuits 309 are coupled with the guard ring 307 in parallel. Input nodes 311 of each of the resonant circuits 309 are individually coupled directly with the guard ring 207. In some embodiments, the input nodes 311 of one or more of the resonant circuits 309 are coupled with a lead line (not shown) that is coupled with the guard ring 307. Noise 319 generated by the first circuit 303 is suppressed by the guard ring 307 and resonant circuit 309 structure having three parallel resonant circuits 309 such that suppressed noise 321 intercepted by the guard ring 307 is dissipated through the inductors 313 and through the capacitors 315 to the ground nodes 317. The second circuit 305 is thereby protected from the suppressed noise 321. The example resonant circuits 309 each comprise identical types of inductors 313 and identical types of capacitors 315. In some embodiments, one or more of the resonant circuits 309 comprise a different combination of types of inductors 313 and capacitors 315. For example, in some embodiments, one resonant circuit 309 of the example resonant circuits 309 includes a meander line inductor and the other resonant circuits 309 include spiral inductors. Similarly, in some embodiments, one resonant circuit 309 of the example resonant circuits 309 includes a MOM capacitor and the other resonant circuits 309 include MIM capacitors.

Figure 3B:
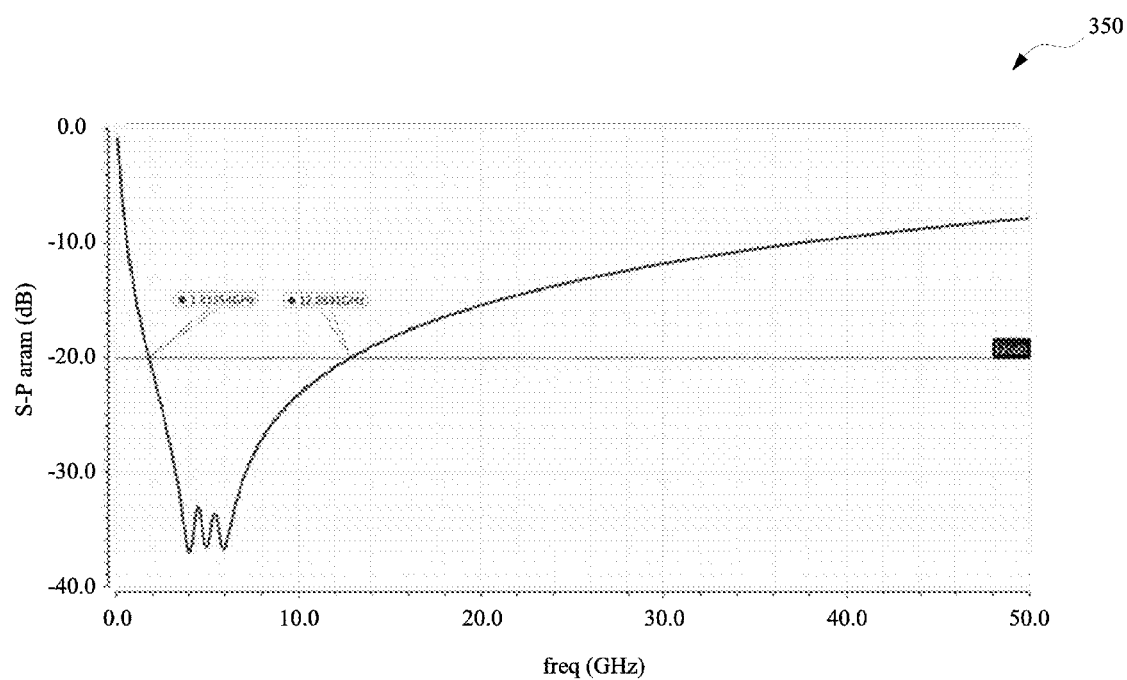
FIG. 3B is a graph showing simulation results demonstrating the effectiveness of the semiconductor device of FIG. 3A at suppressing noise, in accordance with one or more embodiments.

FIG. 3B is a graph 350 showing simulation results demonstrating the effectiveness of semiconductor device 300 at suppressing noise, in accordance with one or more embodiments.

An experiment was conducted to compare the noise suppression capabilities of semiconductor device 300 to the noise suppression capabilities of a semiconductor device that included a guard ring alone. The tested embodiment of semiconductor device 300 included three resonant circuits 309 that comprised a spiral inductor 313 and a parallel plate capacitor 315. The three resonant circuits 309 were coupled with the guard ring 307 in parallel. The simulation results revealed that semiconductor device 300 improved noise suppression by about 20.00 dB in a range of operating frequencies from about 1.83 GHz to about 12.87 GHz compared to the semiconductor device that included a guard ring alone.

Figure 4A:
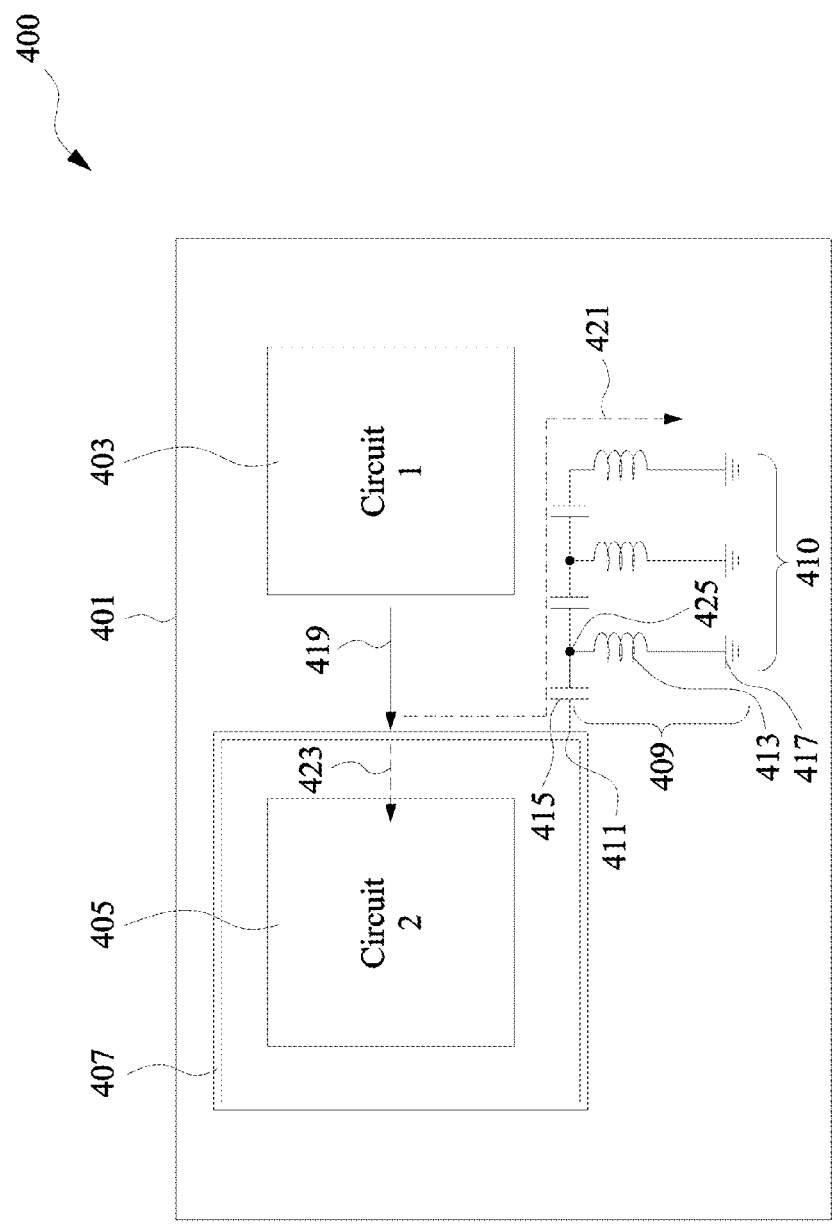
FIG. 4A is a plan view of a semiconductor device having a noise suppression structure, in accordance with one or more embodiments.

FIG. 4A is a plan view of a semiconductor device 400 having a noise suppression structure, in accordance with one or more embodiments. Semiconductor device 400 comprises features similar to semiconductor device 100 (FIG. 1), with the reference numerals increased by 300.

Semiconductor device 400 comprises three resonant circuits 409 that comprise an inductor 413 and a capacitor 415. The resonant circuits 409 are coupled to one another to form a resonant circuit ladder 410. The input node 411 of a first resonant circuit 409 is coupled with the guard ring 307. The input node 411 of each subsequent resonant circuit 409 in the resonant circuit ladder 410 is coupled with a previous resonant circuit 409 at a coupling node 425. Coupling node 425 is between the inductor 413 and the capacitor 415 of the previous resonant circuit 409 in the resonant circuit ladder 410. Noise 419 generated by the first circuit 403 is suppressed by the guard ring 407 and resonant circuit 409 structure having three parallel resonant circuits 409 such that suppressed noise 421 intercepted by the guard ring 407 is dissipated through the inductors 413 and through the capacitors 415 to the ground nodes 417. The second circuit 405 is thereby protected from the suppressed noise 421.

The example resonant circuits 409 each comprise identical types of inductors 413 and identical types of capacitors 415. In some embodiments, one or more of the resonant circuits 409 comprise a different combination of types of inductors 413 and capacitors 415. For example, in some embodiments, one resonant circuit 409 of the example resonant circuits 409 includes a transformer as the inductor 413 and the other resonant circuits 409 include transmission lines as the inductors 413. Similarly, in some embodiments, one resonant circuit 409 of the example resonant circuits 409 includes a MOS capacitor and the other resonant circuits 409 include MOM capacitors.

Figure 4B:
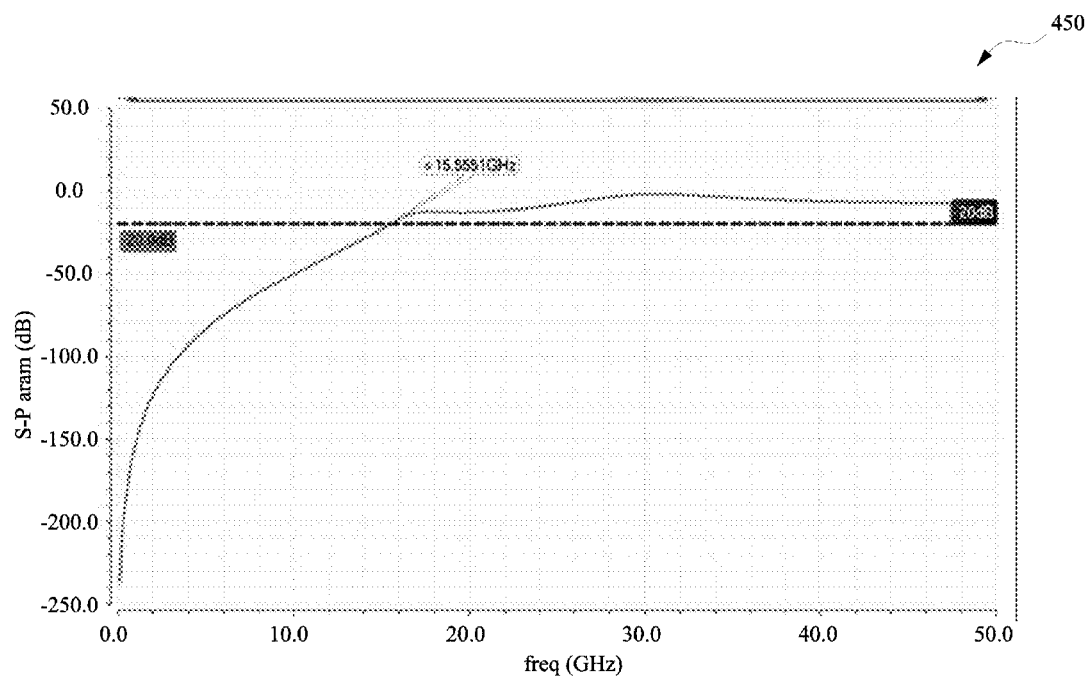
FIG. 4B is a graph showing simulation results demonstrating the effectiveness of the semiconductor device of FIG. 4A at suppressing noise, in accordance with one or more embodiments.

FIG. 4B is a graph 450 showing simulation results demonstrating the effectiveness of semiconductor device 400 (FIG. 4A) at suppressing noise, in accordance with one or more embodiments.

An experiment was conducted to compare the noise suppression capabilities of semiconductor device 400 to the noise suppression capabilities of semiconductor device that included a guard ring alone. The tested embodiment of semiconductor device 400 included three resonant circuits 409 that comprised a spiral inductor 413 and a parallel plate capacitor 415. The three resonant circuits 409 were arranged as a resonant circuit ladder 410 coupled with the guard ring 407 via a first input node 411 of a first resonant circuit 409. The simulation results revealed that the semiconductor device 100 improved noise suppression by about 20.00 dB in a range of operating frequencies from about 0.00 GHz to about 15.55 GHz compared to the semiconductor device that included a guard ring alone.

Figure 5:
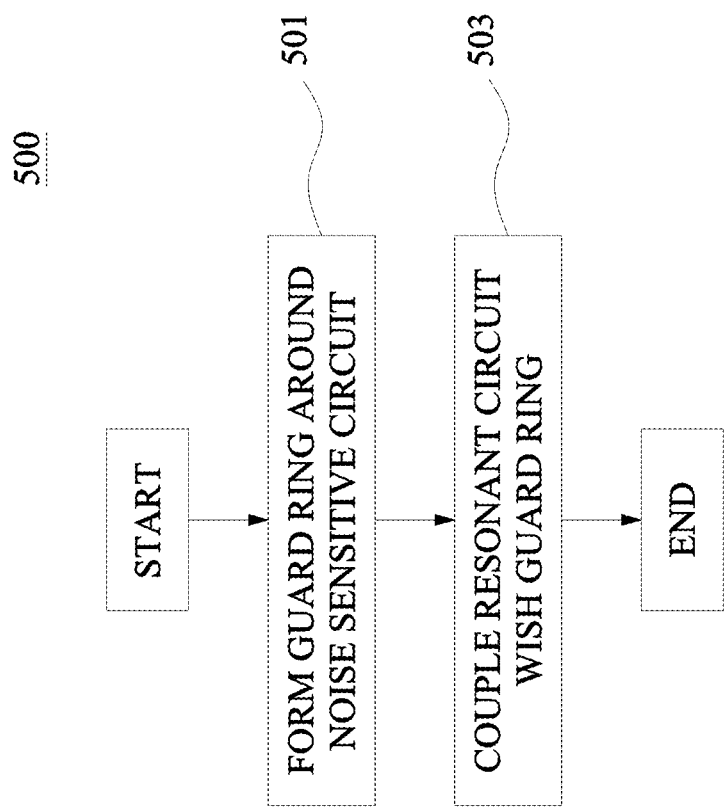
FIG. 5 is a flowchart of a method of forming a semiconductor device, in accordance with one or more embodiments.

FIG. 5 is a flowchart of a method 500 of forming a semiconductor device such as semiconductor device 100 (FIG. 1), in accordance with one or more embodiments.

In step 501, a guard ring such as guard ring 107 (FIG. 1) is formed around a noise sensitive circuit such as second circuit 105 (FIG. 1) connected to a substrate such as substrate 101 (FIG. 1). In some embodiments, the guard ring is a well region formed in the substrate. In some embodiments, the guard ring is formed by doping the substrate with a p-type dopant such as boron, BF2, or other suitable material. In other embodiments, the guard ring is formed by doping the substrate with an n-type dopant such as phosphorous, arsenic, or other suitable material. In some embodiments, the doping is performed conventional by ion implantation, diffusion or other suitable process in a region defined by a photolithography process or other suitable process. In some embodiments, the guard ring comprises a one or more metal layers that are formed by a deposition or plating process around the second circuit. In some embodiments, the guard ring is one or more of embedded in the substrate or formed over the substrate. In some embodiments, more than one guard ring is formed around the second circuit. In some embodiments, one or more guard rings are formed surrounding a noisy circuit such as first circuit 103 (FIG. 1).

In step 503, at least one resonant circuit such as resonant circuit 109 (FIG. 1) is coupled with the guard ring. In some embodiments, the resonant circuit is formed simultaneously with the formation of the guard ring. In some embodiments, the resonant circuit is formed after the guard ring is formed. In other embodiments, the resonant circuit is formed before the guard ring is formed. In some embodiments, the inductor and the capacitor of the resonant circuit are formed simultaneously with one another. In other embodiments, one of the inductor of the capacitor is formed before the other. In some embodiments, the resonant circuit is using one or more of an etching process or a deposition process, or other suitable process usable to form a designed configuration of conductive features or lines in one or more layers of a semiconductor device.

In some embodiments, a portion of the resonant circuit is formed in direct contact with a portion of the guard ring to couple the resonant circuit with the guard ring. In other embodiments, the resonant circuit is coupled with the guard ring by one or more vias formed in at least one layer of the semiconductor device between the guard ring and the resonant circuit. In some embodiments, the resonant circuit is coupled with the guard ring by way of one or more vias and/or one or more conductive layers of the semiconductor device above, below, or on a same level of one or more portions of the resonant circuit and/or the guard ring. A quantity, type, configuration and arrangement of the at least one resonant circuit is selectable to achieve noise suppression in a selected predetermined range of operating frequency of a noise producing circuit such as first circuit 103 (FIG. 1).

An aspect of this description relates to a semiconductor device that comprises a guarded circuit. The semiconductor device also comprises a guard ring surrounding the guarded circuit. The semiconductor device further comprises a resonant circuit coupled with the guard ring. The resonant circuit comprises an input node coupled with the guard ring. The resonant circuit also comprises an inductor. The resonant circuit further comprises a capacitor coupled with the inductor. The resonant circuit additionally comprises a ground node configured to carry a ground voltage. The inductor and the capacitor are coupled between the input node and the ground node.

Another aspect of this description relates to semiconductor device. The semiconductor device comprises a substrate, a first circuit over the substrate, and a second circuit over the substrate. The semiconductor device also comprises a guard ring surrounding the second circuit. The first circuit is outside the guard ring. The semiconductor device further comprises a resonant circuit coupled with the guard ring. The resonant circuit comprises an input node coupled with the guard ring. The resonant circuit also comprises an inductor. The resonant circuit further comprises a capacitor coupled with the inductor. The resonant circuit additionally comprises a ground node configured to carry a ground voltage. The inductor and the capacitor are coupled between the input node and the ground node.

A further aspect of this description relates to method of suppressing signal noise in a semiconductor device. The method comprises forming a guard ring around a noise sensitive circuit over a substrate. The method also comprises coupling a resonant circuit with the guard ring. The resonant circuit comprises, in series, an input node coupled with the guard ring, an inductor, a capacitor, and a ground node configured to carry a ground voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a guarded circuit;
a guard ring surrounding the guarded circuit; and
a resonant circuit directly electrically connected with the guard ring, wherein the resonant circuit comprises:
an input node coupled with the guard ring;
an inductor;
a capacitor coupled with the inductor and separate from the guard ring and the inductor; and
a ground node configured to carry a ground voltage, wherein the inductor and the capacitor are coupled between the input node and the ground node.

2. The semiconductor device of claim 1, wherein the inductor and the capacitor are coupled in series between the input node and the ground node.

3. The semiconductor device of claim 2, wherein the resonant circuit is a first resonant circuit, and the semiconductor device further comprises:
a second resonant circuit coupled with the guard ring.

4. The semiconductor device of claim 3, wherein the first resonant circuit and the second resonant circuit are coupled with the guard ring in parallel.

5. The semiconductor device of claim 3, wherein the second resonant circuit is coupled with the first resonant circuit at a coupling node between the inductor and the capacitor of the first resonant circuit.

6. The semiconductor device of claim 1, wherein the inductor is a spiral inductor.

7. The semiconductor device of claim 1, wherein the inductor is a meander line inductor.

8. The semiconductor device of claim 1, wherein the inductor is disposed over the guard ring.

9. The semiconductor device of claim 1, wherein the capacitor is disposed over the guard ring.

10. A semiconductor device, comprising:
a substrate;
a first circuit connected to the substrate;
a second circuit connected to the substrate;
a guard ring surrounding the second circuit, wherein the first circuit is outside the guard ring; and
a resonant circuit directly electrically connected with the guard ring, wherein the resonant circuit comprises:
an input node coupled with the guard ring;
an inductor;
a capacitor coupled with the inductor and separate from the guard ring and the inductor; and
a ground node configured to carry a ground voltage, wherein the inductor and the capacitor are coupled between the input node and the ground node.

11. The semiconductor device of claim 10, wherein a first side of the inductor is coupled with the input node, a second side of the inductor is coupled with the capacitor and a side of the capacitor opposite the inductor is coupled with the ground node.

12. The semiconductor device of claim 10, wherein a first side of the capacitor is coupled with the input node, a second side of the capacitor is coupled with the inductor and a side of the inductor opposite the capacitor is coupled with the ground node.

13. The semiconductor device of claim 10, wherein the inductor and the capacitor are disposed over the guard ring.

14. The semiconductor device of claim 13, wherein the inductor is a meander line inductor and the capacitor is a metal-oxide-metal capacitor.

15. The semiconductor device of claim 13, wherein the resonant circuit is a first resonant circuit, the semiconductor device further comprises a second resonant circuit coupled with first resonant circuit, and the first resonant circuit and the second resonant circuit are arranged as a resonant circuit ladder.

16. The semiconductor device of claim 13, wherein the resonant circuit is a first resonant circuit, the semiconductor device further comprises a second resonant circuit coupled with the guard ring, and the first resonant circuit and the second resonant circuit are coupled with the guard ring in parallel.

17. The semiconductor device of claim 10, wherein the inductor is a spiral inductor and the capacitor is a metal-insulator-metal capacitor.

18. The semiconductor device of claim 10, wherein the capacitor is a metal-oxide-silicon capacitor.

19. The semiconductor device of claim 10, wherein the second circuit is a voltage control oscillator.

20. A method of forming a semiconductor device, the method comprising:
   forming a guard ring around a noise sensitive circuit over a substrate;
   directly electrically connecting a resonant circuit with the guard ring, wherein the resonant circuit comprises, in series, an input node coupled with the guard ring, an inductor, a capacitor separate from the guard ring and the inductor, and a ground node configured to carry a ground voltage.

* * * * *